United States Patent [19]

Baumann

[11] Patent Number: 4,814,692

[45] Date of Patent: Mar. 21, 1989

[54] CIRCUIT AND METHOD FOR MEASURING AND DIGITIZING THE VALUE OF A RESISTANCE

[75] Inventor: Arthur Baumann, Bertschikon, Switzerland

[73] Assignee: Mettler Instrument AG, Griefensee, Switzerland

[21] Appl. No.: 137,022

[22] Filed: Dec. 22, 1987

Related U.S. Application Data

[63] Continuation of Ser. No. 766,883,, Aug. 16, 1985.

[30] Foreign Application Priority Data

Sep. 6, 1984 [CH] Switzerland ............... 4254/84

[51] Int. Cl.[4] ............... G01R 27/02; H03K 13/20
[52] U.S. Cl. ............... 324/62; 341/166
[58] Field of Search ..... 340/347 R, 347 NT, 347 CC, 340/347 C, 347 AD; 324/99 D, 62 R, 65 R, 64

[56] References Cited

U.S. PATENT DOCUMENTS

| | | |
|---|---|---|
| 3,660,834 | 5/1972 | Picot . |
| 3,786,350 | 1/1974 | Munt . |
| 3,810,152 | 5/1974 | White ............... 340/347 NT |
| 3,875,501 | 4/1975 | Hayashi . |
| 3,875,503 | 4/1975 | Hayashi ............... 340/347 NT |
| 3,895,376 | 7/1975 | Uchida ............... 324/99 D |
| 3,918,050 | 11/1975 | Dorsman ............... 340/347 NT |
| 3,975,727 | 8/1976 | Mader ............... 340/347 NT |
| 4,112,428 | 9/1978 | Dorsman ............... 340/347 NT |
| 4,117,722 | 10/1978 | Helmstetter . |
| 4,228,394 | 10/1980 | Crosby ............... 324/99 D |
| 4,309,692 | 1/1982 | Crosby ............... 340/347 NT |
| 4,349,777 | 9/1982 | Mitamura ............... 324/62 R |
| 4,390,864 | 6/1983 | Ormond ............... 324/99 D |
| 4,588,984 | 5/1986 | Dorsman ............... 340/347 NT |
| 4,598,270 | 7/1986 | Shutt ............... 340/347 NT |

FOREIGN PATENT DOCUMENTS 1566064 4/1980 United Kingdom .

OTHER PUBLICATIONS

Van De Plassche, "A Sigma-Delta Modulator as an A/D Converter", IEEE Transactions on Circuits and Systems, Jul. 1978 at 510.
Jaeger and Daneshvar, "Design Limitations of Switched Capacitor Delta-Sigma ADCS", Proceedings of the Sixth Beinnial University/Government/Industry Microelectronics Symposium. Jun. 1985 at 152.
Harrison, Hellworth and Jaeger, "Delta-Sigma A/D Conversion Can Save $$ In Slow-Speed Applications", EDN, vol. 18, No. 6, Mar. 20, 1973 at 78.

Primary Examiner—Reinhard J. Eisenzopf
Assistant Examiner—Jose M. Solis
Attorney, Agent, or Firm—Pennie & Edmonds

[57] ABSTRACT

The invention relates to a circuit and a method adapted for measuring and digitizing the value of a resistance. The circuit includes and A/D converter operating in accordance with a charge balancing principle, and a resistance network connected to the A/D converter so that the resistance is both a component of the A/D converter and of the resistance network. The A/D converter and the resistance network are interconnected in such a manner so as to permit only a purely resistive measurement. A processor is connected to the A/D converter for obtaining a composite measured resistance value from a plurality of individual measured resistance values. The method according to the invention permits accurate (or precise) resistance measurements having a high degree of resolution of an order of magnitude of $10^5$ points. The method is applicable in particular for temperature measurements, for example in calorimeters or in precision scales, but also in other resistance measurements.

20 Claims, 4 Drawing Sheets 4,814,692

CIRCUIT AND METHOD FOR MEASURING AND DIGITIZING THE VALUE OF A RESISTANCE

This is a continuation of application Ser. No. 766,883, filed Aug. 16, 1985.

FIELD OF THE INVENTION

The present invention relates to a circuit and a method for measuring and digitizing a resistance, particularly a resistance employed in a temperature sensor.

BACKGROUND OF THE INVENTION

Conventional circuits of this type include as a rule open loop systems. In other words, the signal from a sensor measuring the value is supplied to an analog-to-digital converter (A/D converter) without any feed back coupling or any feed back from the converter to the sensor circuit. This is evident, for example, from the article "Mikrovolt Messen" (Funkschau 14/1983, pp. 37/38) which describes and A/D converter, which operates in accordance with the principle of charge balancing (called hereinbelow ChB), and wherein there is supplied a signal, for example from a temperature sensor, to an input of the A/D converter. The ChB method is known, for example, from "Elektronik", vol. 12/1974, pp. 469–472, and from U.S. Pat. No. 3,790,886. Special temperature measuring circuits of this type are known from the German published application Nos. 3,129,476 and 3,130,499. Both also use an "open loop" system of a sensor measuring a value and an A/D converter. Moreover, in neither case is a pure resistance ratio measurement made. In one case the resistances of the switches, which connect the reference- or the measured resistance to the A/D converter, are included in the measurement (3,129,476). In the other case (3,130,499) the capacity of a capacitor is included in the measured value determination, and can affect the accuracy of the results.

SUMMARY OF THE INVENTION

Accordingly, it is an object of the present invention to provide a circuit and a method by which, as a result of substantial elimination of any possible error sources, very precise resistance measurements having a high measured value resolution are possible, especially for temperature sensors.

In keeping with these objects and with others which will become apparent hereinafter, one feature of the present invention resides, briefly stated, in a circuit in which the resistance to be measured is both a component of an A/D converter, which operates in accordance with a charge balancing principle, and is also a component of a resistance network. The circuit permits both a pure resistance measurement, and attainment of a composite measured value from a plurality of individual measured values.

This concept means that the sensor measuring the value and the A/D converter are merged into a "closed loop" system. As will become clear from the following description, the A/D converter is connected to the circuitry of the resistance to be measured as part of a feedback loop. This feature, in conjunction with obtaining a composite measured value from several individual measured values provides a high resultant resolution. Moreover, the inventive concept has the advantage that high accuracy voltage or current reference sources can be dispensed with; it requires only precision resistances, which, for a comparable long-time stability, are considerably less expensive, than high-accuracy voltage- or current-reference sources.

It is conventional to operate the comparator of a ChB converter against a fixed potential. This, however, means that the individual converting time periods or intervals would have different respective durations depending on the measured value. In accordance with an advantageous embodiment the comparator is connected to a periodical saw-tooth voltage generator. This embodiment provides for an operation at fixed time periods or time intervals, which in turn is advantageous for processing the digital measured value. Thus digital filtering, which further considerably improves the quality of the measurement, is made possible in a simple manner.

For the cases in which different resistances must be measured, a further elaboration of the circuit provides for additional switches, which allow switching between several resistances. In this manner it is possible, for example, to encompass several temperature measuring points in a heat flow calorimeter.

The invention also covers a method of the abovementioned type, in which a current $i_x$ is dependent on a predetermined voltage, and further is dependent on the magnitude of the resistance to be measured. That current, in turn, is used as a measure for the magnitude of that resistance, and is converted, according to the charge balancing principle, into a digital value. In accordance with the invention the current $i_x$, which flows through the rsistance to be measured is maintained by the very charge balancing circuit serviang to digitize the value of that resistance.

Advantageously, the method is performed so that a timing circuit produces time periods of constant duration, which are in turn subdivided into first and second time intervals, and wherein a current $i_x$ is drawn alternately during the first time interval from a supply voltage, and during the second time interval from an integrator of the charge balancing circuit. During the first time interval a current $i_1$, which is also drawn from the supply voltage, flows in the integrator; the output voltage of the integrator is compared in a comparator with a periodic saw-tooth voltage. During the first or the second time interval high frequency timing pulses are supplied through a gating circuit to a counting and evaluating circuit, and the sum of the timing pulses forms a measure for the magnitude or value of the resistance; for the purpose of indicating the value of the resistance, a plurality of the sums of the timing pulses are evaluated.

The novel features of the present ainvention are set forth in particular in the appended claims. The invention itself, however, both as to its construction and its manner of operation will be understood from the following description of preferred embodiments which are accompanied by the appended drawings.

DESCRIPTION OF THE PREFERRED EMBODIMENTS

Figure 1:
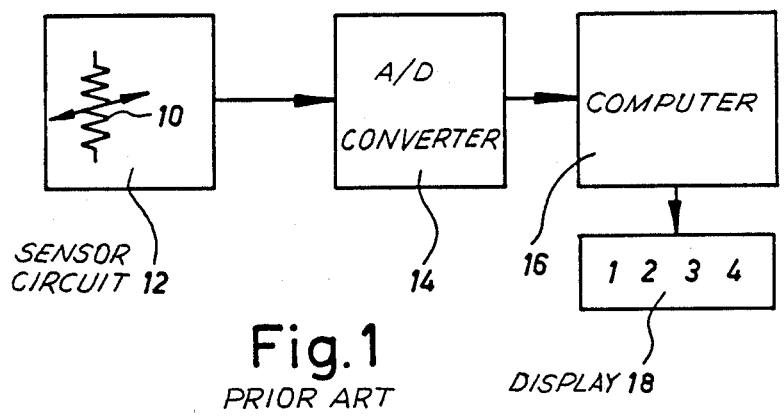
FIG. 1 is a block circuit diagram of the prior art.

FIG. 1 shows a known arrangement of the above-mentioned type. A resistance 10 to be measured is a component of a sensor circuit 12. The resultant analog measured signal is supplied to an A/D converter 14. The resulting digital measurement signal is processed, if desired with corrections, in a circuit 16 for display on a digital indicator 18. In the conventional methods the generation and transformation (for example amplification) of the analog measured signal is independent of any subsequent conversion into a digital magnitude; in other words one deals here with an open loop system.

Figure 2:
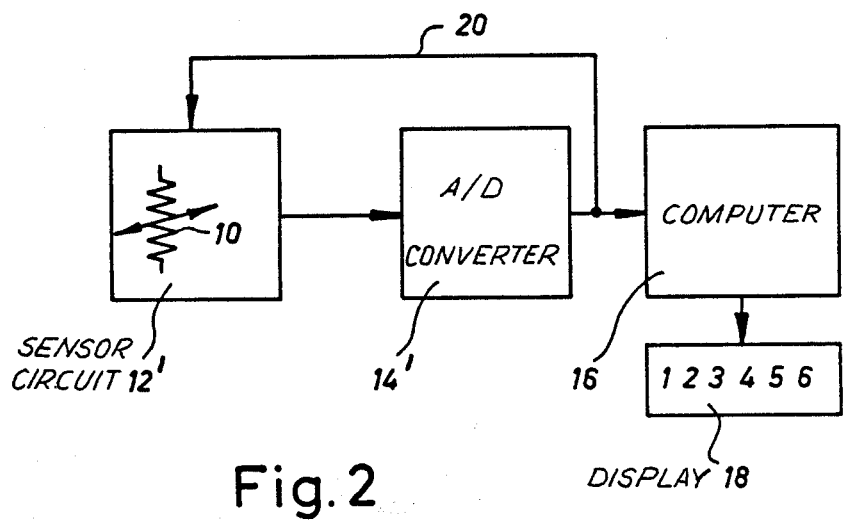
FIG. 2 is a block circuit diagram schematically showing an arrangement in accordance with the present invention.

The present invention differs from the conventional circuit and method. In accordance with the invention the magnitude of the digitized signal affects the generation and processing of the analog measured signal by feedback, as symbolized in FIG. 2, by the use of a feed back conductor 20. There results a closed system (12', 14', 20), which is formed as a closed control loop or regulating circuit. Contrary to open loop systems, the closed control loop suppresses many disturbances from amplifiers and other modular elements, which disturbances or errors cannot be prevented even by integration or averaging of many individual values in open loop systems.

Figure 3:
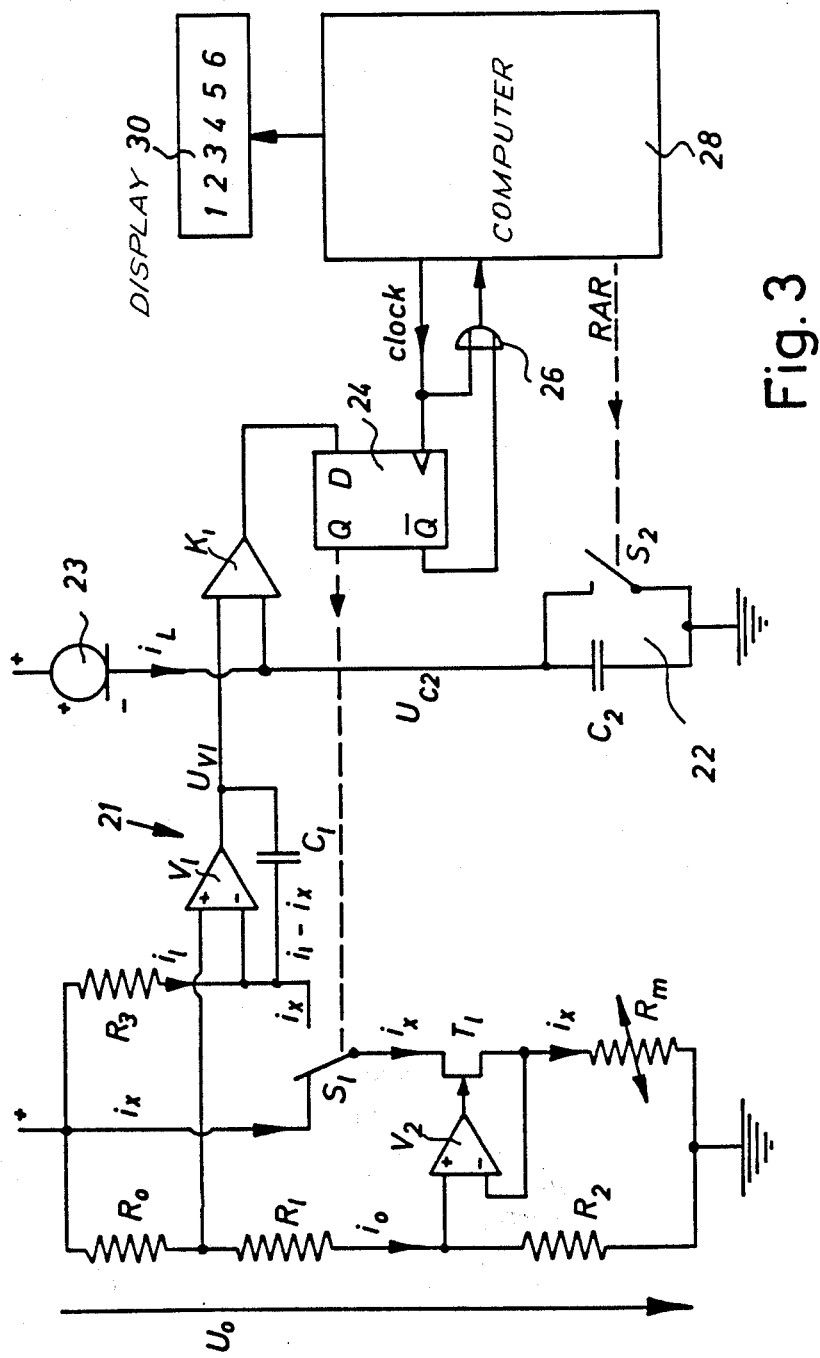
FIG. 3 is a circuit diagram of the inventive arrangement in accordance with one embodiment of the invention.

FIG. 3 shows a circuit in accordance with one embodiment of the invention. A resistance network includes two precision resistances $R_o$ and $R_2$ arranged in series, and a resistance $R_1$ interconnected therebetween, which latter need not be of a high accuracy. A second set of resistors is connected in parallel with the resistors mentioned above, and includes a precision resistance $R_3$, and a resistance $R_m$ which is to be measured, which in the example illustrated forms part of a temperature sensor in a calorimeter. The network is connected to a supply voltage $U_o$. A current sink is provided in its lower part (difference amplifier $V_2$ and field effect transistor $T_1$). To the upper part there is connected an integrator 21 (difference amplifier $V_1$, capacitor $C_1$). A switch $S_1$ is connected between $R_3$ and $T_1$, which alternately closes the current path either between $R_3$ and $R_m$, or between the plus pole of the supply voltage and $R_m$. A comparator $K_1$ is connected with the output of the integrator 20, and has a second input connected to a saw-tooth voltage generator 22 (current source 23, capacitor $C_2$, switch $S_2$). The output of the comparator $K_1$ is applied to the D-input of a flip-flop 24, which controls the switch $S_1$ and a gate 26 synchronously with the clock frequency. Reference numeral 28 identifies digital circuitry, which, for example, includes an oscillator for the clock or timing impulses, a time control for the saw-tooth voltage generator 22 (signal RAR=ramp reset), and a counting and evaluating circuit, as well as a control for a digital indicator 30. The details of the digital circuitry 28, which is substantially formed by a suitably programmed microcomputer, is not a part of the invention, but is of conventional design, and does not therefore require any further explanation.

Figure 4:
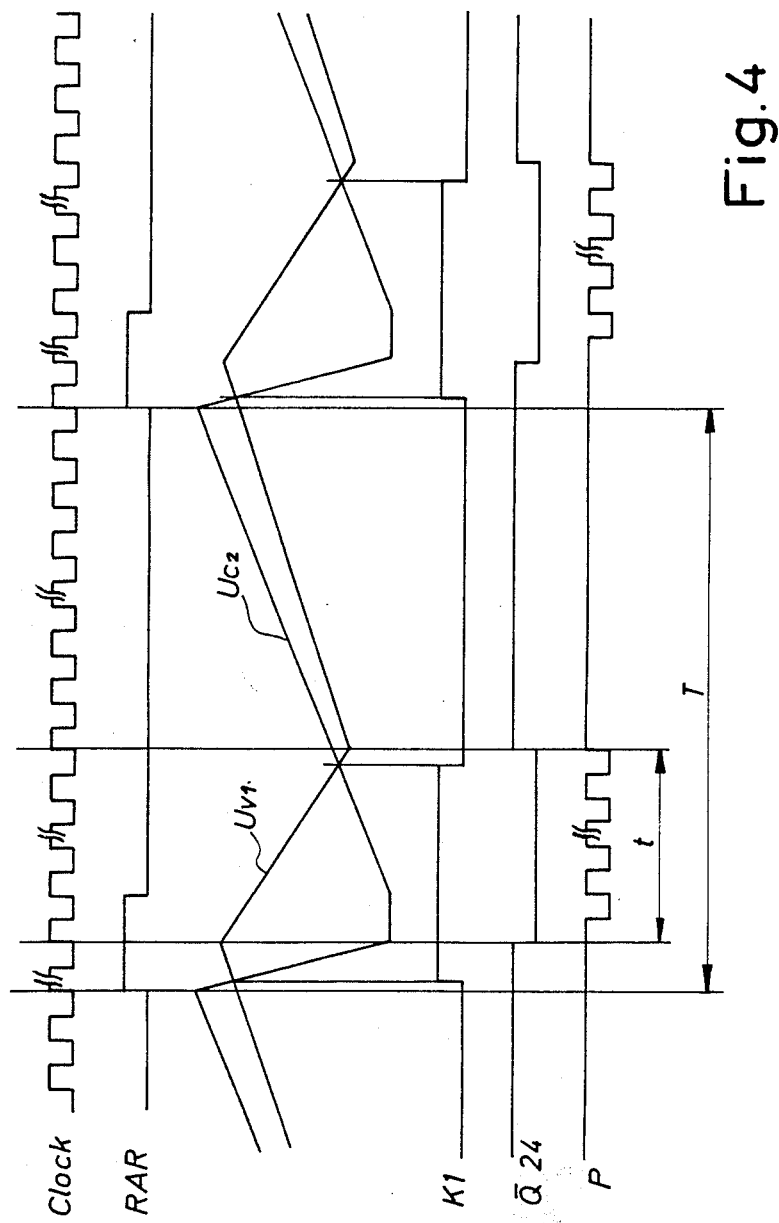
FIG. 4 is a signal diagram.

The operation of the circuit will be explained with reference to FIG. 4. At the beginning of one individual measuring period (ramp) T the switch $S_2$ of the saw-tooth generator 22 is closed by the signal RAR for a predetermined short time interval (for example 16 timing impulses). In this time interval the saw-tooth voltage $U_{C2}$ decreases to zero. It thereby drops below the output voltage $U_{V1}$ of the integrator 21. At this moment the output of the comparator $K_1$ changes to a logic "1", and causes the following events to occur at the next timing impulse througha the flip-flop 24:

the switch $S_1$ assumes the position shown in FIG. 3, and the gate 26 opens.

This means that a current $i_1$ flows in the integrator 21, so that its output voltage $U_{V1}$ decreases linearly, the current $i_x$, which flows through the resistance $R_m$ and is proportional thereto, is drawn from the supply voltage, and timing impulses P are supplied through the gate 26 to the counter of the digital circuitry 28.

As soon as the voltage $U_{V1}$ falls below the saw-tooth voltage $U_{C2}$, the output of the comparator $K_1$ turns to logic "0". This in turn, causes the following events to occur through the flip-flop 24 at the next timing impulse:

the gate 26 is closed, and the switch $S_1$ is switched over.

Now the integrator 21 is discharged at a current $i_1 - i_x$, wherein $i_x > i_1$. The current sink $V_2$, $T_1$ draws the current $i_x$ partially from the integrator 21, and the output voltage $U_{V1}$ increases again linearly, until the cycle after the end of the period T is again resumed by the signal RAR.

The operational principle of the charge balancing circuit can now be clearly understood. On average the same charge is supplied to the integrator 21 (current $i_1 \cdot t$) as is withdrawn therefrom at a current $(i_1 - i_x) \cdot (T-t)$ and wherein $i_x > i_1$.

The timing impulses P counted during the time period t are a measure of the unknown resistance $R_m$. As can easily be deduced, the magnitude of the resistance $R_m$ is obtained from the formula $$R_m = \frac{R_2 \cdot R_3}{R_o} \cdot \frac{(T-t)}{T}$$

This means that a pure measurement of relative resistance takes place, in which only the values of the precision resistance $R_o$, $R_2$ and $R_3$, as well as the time intervals T and t are present. In a simple manner and with simple means an accurate measurement is therefore made possible.

For a further improvement of the accuracy, and so as to attain the desired ensuing high resolution, the individual sums of the timing impulses P obtained from a plurality of periods T are summed, and subsequently, after known filtering, linearization and rounding off performed in a microcomputer, are indicated on the indicator 30.

Some approximative numerical values will be presented for illustrative purposes:

timing or clock frequency: 5 MHz period T: 1 ms (approximately 4000 impulses are maximally usable per period)

number of periods per resultant indication: 1000, namely a coarse result yields 4 million points, while the indicated range (after rounding off) equals 400,000 points.

Therefore a digital thermometer was, for example, realized in a region of from $-100°$ to $+200°$ at a resolution of 0.001°.

It is to be understood that the above-mentioned numerical values (clock or timing frequency, period duration, number of timing periods per result or indication)

can be varied within wide a range in dependence on conditions.

Figure 5:
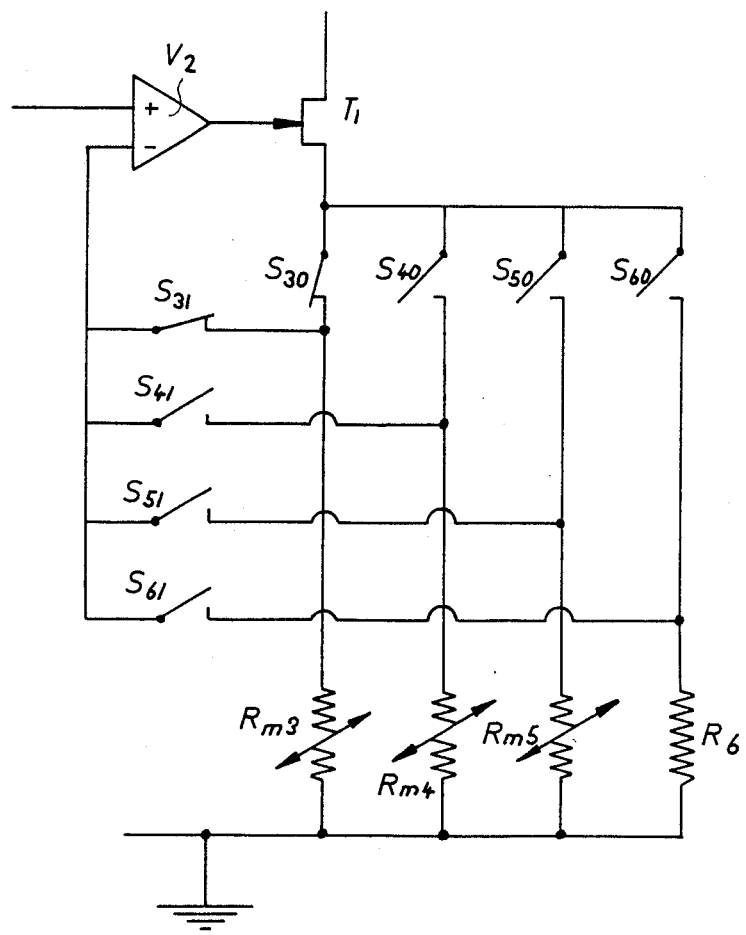
FIG. 5 is a modification of the circuit of FIG. 3.

FIG. 5 shows a variant of the invention. It is obtained with a practically unchanged construction of the circuit (just the control program in the digital circuitry must be correspondingly adapted), by introducing additional switches for switching between various resistances to be measured.

Three resistances $R_{m3}$ $R_{m4}$ and $R_{m5}$ to be measured are linked via respective switch pairs $S_{30}$, $S_{31}$ or $S_{40}$, $S_{41}$, or $S_{50}$, $S_{51}$ with the current sink $V_2$, $T_1$. Additionally a precision resistance $R_6$ with switches $S_{60}$, $S_{61}$ is provided, by means of which a calibration can be performed. During calibration a predetermined value for the time period t is to appear through a plurity of measured periods (ramps).

As can be seen from FIG. 5, only that switch pair is closed (for example $S_{30}$, $S_{31}$) which is associated directly with the resistance to be measured. All other switches are open. The resistance of the switches does not influence or affect the result. The circuit control is performed in a known manner by signals of the timing circuit of the digital circuitry 28 (not shown), which can be performed by corresponding programming of the microcomputer. A typical case of utilization of this variant would, for example, be an alternating measurement of several temperature measuring locations in a system.

With suitable adaptation of the evaluation computations in the digital circuitry 28, both the time t (as in the first example), and the time (T−t) may be utilized for counting of the timing impulses P.

I claim:

1. A circuit adapted for measuring and digitizing a parameter of at least a first resistive device comprising:
    an integrator which is alternately charged in a charging cycle and discharged in a discharging cycle, the charge passed to said integrator during said charging cycle substantially equaling the charge discharged from said integrator during said discharge cycle,
    means for charging said integrator through a first resistor,
    means for discharging said integrator through a second resistor,
    voltage reference means comprising a voltage source for supplying current to a voltage divider network and for supplying a charging current to said integrator, said voltage divider network comprising third and fourth resistors, the voltage across said third resistor providing a charging voltage reference, the voltage across said fourth resistor providing a discharging voltage reference,
    charging control means for maintaining said charging voltage reference across said first resistor,
    discharging control means for maintaining said discharging voltage reference across said second resistor,
    one of said first, second, third and fourth resistors being said first resistive device having said parameter to be measured and digitized and the other three resistors being precision resistors having known resistances,
    processing means connected to said integrator for measuring the duration of at least one of the charging and discharging cycles and for calculating from the duration of the charging and discharging cycles and from known values of passive components including said precision resistors said parameter of said first resistive device.

2. The circuit of claim 1 wherein a first terminal each of said second resistor, said fourth resistor and of said voltage source are electrically common and wherein said means for discharging comprises switching means for enabling current to flow from said integrator through said second resistor and wherein said discharging control means comprises a variable impedance device connected in series with said second resistor, and
    an operational amplifier,
        a noninverting input terminal of said amplifier being connected to a second terminal of said fourth resistor,
        an inverting input terminal of said amplifier being connected to a second terminal of said second resistor, and
        an output terminal of said amplifier providing a signal to a control input of said variable impedance device thereby modulating the impedance of said variable impedance device to maintain the potential at said second terminal of said second resistor at the same potential as said second terminal of said fourth resistor.

3. The circuit of claim 2 wherein the second resistor is said first resistive device.

4. The circuit of claim 3 wherein first terminals of said first resistor, said third resistor and said voltage source are electrically common and wherein said integrator comprises an operational amplifier, a noninverting terminal of said amplifier being connected to a second terminal of said third resistor, and an inverting terminal of said amplifier being connected to a second terminal of said first resistor.

5. The circuit of claim 4 wherein a fifth resistor is connected in series with said fourth and fifth resistors, a first terminal of said fifth resistor being connected to said second terminal of said third resistor, and a second terminal of said fifth resistor being connected to said second terminal of said fourth resistor.

6. The circuit of claim 5 wherein the parameter that is measured and digitized is the resistance of the first resistive device.

7. The circuit of claim 6 wherein said first resistive device is a component of a temperature sensor.

8. The circuit of claim 7 wherein said processing means further comprises a composite measuring means for determining the parameter of said first resistive device based on a plurality of measurements of the duration of at least one of the charging cycle and the discharging cycle.

9. The circuit of claim 8 further comprising a second switching means for selecting from a plurality of resistors having unknown resistances at least one first resistive device having a parameter to be measured.

10. The circuit of claim 1 wherein a first terminal each of said first resistor, said third resistor and said voltage source are electrically common and wherein said means for charging comprises switching means for enabling current to flow through said first resistor to said integrator, and wherein said charging control means comprises a variable impedance device connected in series with said first resistor, and
    an operational amplifier,
        a noninverting input terminal of said amplifier being connected to a second terminal of said third resistor, an inverting input terminal of said amplifier being connected to a second terminal of said first resistor, and an output terminal of said amplifier providing a signal to a control input of said variable impedance device thereby modulating the impedance of said variable impedance device to maintain the potential at said second terminal of said first resistor at the same potential as said second terminal of said third resistor.

11. A method for measuring and digitizing a parameter of at least a first resistive device comprising:

alternately charging an integrator in a charging cycle and discharging said integrator in a discharging cycle, the charge passed to said integrator during said charging cycle substantially equaling the charge discharged from said integrator during said discharge cycle, said integrator being charged through a first resistor and, discharged through a second resistor, controlling the magnitude of current charging and discharging said integrator by means of a voltage reference device comprising a voltage source for supplying current to a voltage divider network and for supplying a charging current to said integrator, said voltage divider network comprising third and fourth resistors, the voltage across said third resistor providing a charging voltage reference, the voltage across said fourth resistor providing a discharging voltage reference, one of said first, second, third and fourth resistors being said first resistive device having said parameter to be measured and digitized and the other three resistors being precision resistors having known resistances, maintaining said charging voltage reference across said first resistor, maintaining said discharging voltage reference across said second resistor, measuring the duration of at least one of the charging and discharging cycles, and calculating, from the duration of said charging and discharging cycles and from known values of passive components including said precision resistors, said parameter of said first resistive device.

12. The method of claim 11 wherein a first terminal each of said second resistor, said fourth resistor and of said voltage source are electrically common further comprising the steps of:

enabling current to flow from said integrator through said second resistor to begin said discharging cycle, controlling the impedance of a variable impedance device connected in series with said second resistor by means of, an operational amplifier, a noninverting input terminal of said amplifier being connected to a second terminal of said fourth resistor, an inverting input terminal of said amplifier being connected to a second terminal of said second resistor, and an output terminal of said amplifier providing a signal to a control input of said variable impedance device thereby modulating the impedance of said variable impedance device to maintain the potential at said second terminal of said second resistor at the same potential as said second terminal of said fourth resistor.

13. The method of claim 12 wherein the second resistor is the first resistive device.

14. The method of claim 12 wherein first terminals each of said first resistor, said third resistor and said voltage source are electrically common and wherein said integrator comprises an operational amplifier, a noninverting terminal of said amplifier being connected to a second terminal of said third resistor, and an inverting terminal of said amplifier being connected to a second terminal of said first resistor.

15. The circuit of claim 14 wherein a fifth resistor is connected in series with said fourth and fifth resistors, a first terminal of said fifth resistor being connected to said second terminal of said third resistor, and a second terminal of said fifth resistor being connected to said second terminal of said fourth resistor.

16. The method of claim 15 wherein the parameter that is measured and digitized is the resistance of the first resistive device.

17. The method of claim 16 wherein the first resistive device is part of a temperature sensor.

18. The method of claim 17 wherein said processing means further comprises a composite measuring means for determining the parameter of said first resistive device based on a plurality of measurements of the duration of at least one of the charging cycle and the discharging cycle.

19. The method of claim 18 further comprising a second switching means for selecting from a plurality of resistors having unknown resistances at least one first resistive device having a parameter to be measured.

20. The method of claim 11 wherein a first terminal each of said first resistor, said third resistor and said voltage source are electrically common and further comprising the steps of:

enabling current to flow through said first resistor to said integrator to begin said charging cycle, controlling the impedance of a variable impedance device connected in series with said first resistor by means of, an operational amplifier, a noninverting input terminal of said amplifier being connected to a second terminal of said third resistor, an inverting input terminal of said amplifier being connected to a second terminal of said first resistor, and an output terminal of said amplifier providing a signal to a control input of said variable impedance device thereby modulating the impedance of said variable impedance device to maintain the potential at said second terminal of said first resistor at the same potential as said second terminal of said fourth resistor.

* * * * *

UNITED STATES PATENT AND TRADEMARK OFFICE
CERTIFICATE OF CORRECTION

PATENT NO. : 4,814,692

DATED : March 21, 1989

INVENTOR(S) : Arthur Baumann

It is certified that error appears in the above-identified patent and that said Letters Patent is hereby corrected as shown below:

Cancel claims 10 and 20.

Claim 4, line 2, after "resistor" (first appearance) delete the comma and substitute therefor --and--; before "said voltage" insert --a second terminal of--;

Claim 5, line 2, delete "fourth and fifth" and substitute therefor --third and fourth--;

Claim 14, line 2, delete "each"; after "resistor" (first appearance) delete the comma and substitute therefor --and--; before "said" (third appearance) insert --a second terminal of--;

Claim 15, line 1, delete "circuit" and substitute therefor --method--;

Claim 15, line 2, delete "fourth and fifth" and substitute therefor --third and fourth--.

Signed and Sealed this

Seventh Day of November, 1989

*Attest:*

JEFFREY M. SAMUELS

*Attesting Officer*     *Acting Commissioner of Patents and Trademarks*